United States Patent [19]
Mizusawa et al.

[11] Patent Number: 5,805,986
[45] Date of Patent: Sep. 8, 1998

[54] HIGH-FREQUENCY STEP ATTENUATOR SUITABLE FOR TRANSMISSION CIRCUIT

[75] Inventors: Nishiki Mizusawa; Tsutomu Sato, both of Kanagawa, Japan

[73] Assignee: Sony Corporation, Tokyo, Japan

[21] Appl. No.: 661,407

[22] Filed: Jun. 7, 1996

[30] Foreign Application Priority Data

Jun. 16, 1995 [JP] Japan ................................ 7-150482

[51] Int. Cl.⁶ .............................. H01Q 11/12; H04B 1/04
[52] U.S. Cl. ........................................ 455/126; 455/115
[58] Field of Search .................................. 455/115, 126, 455/127, 117; 330/279, 129, 298

[56] References Cited

U.S. PATENT DOCUMENTS

| | | | |
|---|---|---|---|
| 5,113,525 | 5/1992 | Andoh | 455/127 |
| 5,337,006 | 8/1994 | Miyazaki | 330/130 |
| 5,376,895 | 12/1994 | Aihara | 330/129 |
| 5,566,363 | 10/1996 | Senda | 455/126 |

*Primary Examiner*—Reinhard J. Eisenzopf
*Assistant Examiner*—G. Arthur
*Attorney, Agent, or Firm*—Jay H. Maioli

[57] ABSTRACT

A high-frequency signal step attenuator including an amplifying circuit having a transistor element with its base or gate connected to an input terminal to which a high-frequency input signal is supplied, and supplying an amplified output signal of the input signal to an output terminal, a current detector for detecting a current flowing through a current path of collector-emitter or a current path of drain-source of the transistor element to generate an output voltage corresponding to a detected current, a voltage setter for selectively generating output voltages of different levels, and a comparator for comparing the output voltage of the current detector with the output voltage of the voltage setter, and supplying an output signal of a compared result as a feedback signal to the base or gate of the transistor element.

3 Claims, 5 Drawing Sheets

HIGH-FREQUENCY STEP ATTENUATOR SUITABLE FOR TRANSMISSION CIRCUIT

BACKGROUND OF THE INVENTION

The present invention relates to a high-frequency step attenuator suitable for a transmission circuit of a mobile station of a radio communication system, e.g., portable telephone system.

A PDC, which is a Japanese digital cellular phone system, i.e., portable telephone system including a base station and a mobile station and a transmission output electric power of mobile station is controlled by transmitting a transmission output control signal for controlling a transmission power from the base station to the mobile station.

In the specification of such portable telephone system, in the case of a mobile station with transmission power of 0.8 W, under the condition that the maximum transmission output power is 0 dB, it is requested that the transmission output power can be controlled in a range of from 0 to 20 dB at steps of 4 dB. As a control circuit for controlling a transmission output power of a transmission circuit, there are known circuits shown in FIGS. 1 and 2.

In the circuit shown in FIG. 1, a baseband signal of digital audio data converted from an analog audio signal is supplied through an input terminal 40 to an orthogonal modulator 41, in which it is modulated at 900 MHz band by using a local oscillation signal from a local oscillator 42 as a carrier signal.

A modulated signal is supplied through a step attenuator 44 whose gain (attenuation amount) is controlled by a control signal from a control terminal 43 to a variable gain amplifier (VGA) 45 which will be described later on. An output signal from the variable gain amplifier 4 is supplied to a power amplifier 46, and a transmission output signal from the power amplifier 46 is supplied through a directional coupler 47 and an isolator 48 to an antenna 49.

A part of the transmission output signal from the power amplifier 46 is supplied from the directional coupler 47 and supplied through a detector 50 to a smoothing circuit 51, and thereby detected in level. A detected level from the smoothing circuit 51 is supplied to one input terminal of a comparator 52, and a reference voltage, which will be described later on, from a reference voltage generating unit 53 is supplied to the other input terminal of the comparator 52. A compared result output signal from the comparator 52 is supplied to a control portion of the above variable gain amplifier 45.

Therefore, according to this circuit, the level of the transmission output signal from the power amplifier 46 is controlled by an attenuation amount set in the above step attenuator 44. Also, the compared result output signal from the comparator 52 is supplied to a gain control terminal of the variable gain amplifier 45, thereby effecting a feedback control in such a manner that a difference between the level of the transmission output signal from the power amplifier 46 and the reference voltage from the reference voltage generating unit 53 becomes constant.

During a period in which the mobile station with this circuit shown in FIG. 1 incorporated therein is moved, the base station transmits a transmission output control signal for causing the reception level to become its lowest level. Then, this transmission output control signal is received by the mobile station, and the control signal supplied to the control terminal 43 and the reference voltage generated from the reference voltage generating unit 53 are set in accordance with the received transmission output control signal.

Accordingly, the attenuation amount of the step attenuator 44 is set by the control signal from the control terminal 43, and the gain of the variable gain amplifier 45 is set by the compared result output signal from the comparator 52. Thus, the level of the transmission output from the power amplifier 46 is controlled in accordance with the transmission output control signal from the base station. Also, the transmission output power supplied to the antenna 49 is controlled so as to fall to the level in which the reception level of the base station becomes lowest.

Further, the step attenuator 44 is arranged such that the attenuation amount thereof can be set in a range of from 20 dB at steps of 4 dB. With this arrangement, in the case of the mobile station with the transmission output power of 0.8 W, the transmission output power can be set in a range of from 0 to −20 dB at steps of 4 dB wherein the maximum transmission power is set to 0 dB.

In the circuit shown in FIG. 2, the modulated signal from the orthogonal modulator 41 is directly supplied to the variable gain amplifier 45. A part of the transmission output signal from the power amplifier 46 is supplied from the directional coupler 47, and supplied through the step attenuator 44 whose attenuation amount is controlled by the control signal from the control terminal 43 and the detector 50 to the smoothing circuit 51. Similarly to the circuit shown in FIG. 1, the level detected by the smoothing circuit 51 is compared with the reference voltage from the reference voltage generating unit 53 by the comparator 52. A compared output from the comparator 52 is supplied to the gain control terminal of the variable gain amplifier 45.

Therefore, according to this circuit, a feedback control is executed such that a difference between the level which results from attenuating the level of the transmission output from the power amplifier 46 by the attenuator 44 and the constant reference voltage from the reference voltage terminal 54 becomes constant. Thus, the level of the transmission output from the power amplifier 46 is controlled in inverse proportion to the attenuation amount set in the step attenuator 44.

In the circuit shown in FIG. 2, the attenuation amount set in the step attenuator 44 is controlled in inverse proportion to the transmission output control signal from the base station. Thus, similarly to the circuit shown in FIG. 1, the transmission output power supplied to the antenna 49 can be controlled so as to fall within the range in which the reception level at the base station can be mad e lowest.

In this manner, the transmission output power of the mobile station can be controlled in accordance with the transmission output control signal transmitted from the base station to the mobile station. Therefore, an interference caused for other base station due to an excessively large transmission level can be prevented, and the power consumption of a battery housed in the mobile station can be reduced, thereby making it possible to extend a life of the battery.

The circuit shown in FIG. 1 uses the step attenuator 44 as the preceding stage of the variable gain amplifier 45, for example. Specifically, in the PDC, a variable gain amplifier needs a dynamic range of 30 dB or larger at minimum. As a result, the dynamic range of the variable gain amplifier composed of one element is not sufficient, and such variable gain amplifier should be composed of two elements or more. Of these two elements, one element is used as the step attenuator 44.

Therefore, in this circuit, with respect to the variable gain amplifier formed of the element other than that used as the step attenuator 44, an operation point of the variable gain amplifier at each transmission output can be made constant, and characteristics can be stabilized.

In the circuit shown in FIG. 2, the level supplied to the detector 50 can be made substantially constant by controlling the attenuation amount of the step attenuator 44 in response to the setting of transmission output power. Accordingly, the level of the signal supplied to the comparator 52 from the detector 50 can be made substantially constant, whereby the reference voltage from the reference voltage terminal 54 can be made constant and the transmission output power can be controlled, thereby simplifying the circuit arrangement.

In the circuits shown in FIGS. 1 and 2, high-frequency signals are supplied to the step attenuator 44, and these high-frequency signals should be attenuated at a desired step value without deteriorating characteristics. FIG. 3 shows a apparatus that is used as a high-frequency step attenuator for such purposes.

As shown in FIG. 3, there are provided terminals 60 and 61 on both sides. One terminal 60 is connected through a change-over switch 62 to a resistor 63 with an attenuation amount of 4 dB and one end of line with an attenuation amount of 0 dB. The resistor 63 and the other end of the line 64 are connected through a change-over switch 65 to one end of a line 66. The other end of the line 66 is connected through a change-over switch 67 to a resistor 68 with an attenuation amount of 8 dB and one end of a line 69 with an attenuation amount of 0 dB.

The resistor 68 and the other end of line 69 are connected through a change-over switch 70 to one end of a line 71. Further, the other end of the line 71 is connected through the change-over switch 72 to a resistor 73 with an attenuation amount of 16 dB and one end of a line 74 with an attenuation amount of 0 dB. Then, the resistor 73 and the other end of the line 74 are connected through a change-over switch 75 to the terminal 61.

Therefore, in this apparatus, assuming that "1" represents the case that the change-over switches 62, 65, 67, 70, 72, 75 are connected to the sides of the resistors 63, 68, 73 and that "0" represents that case that the change-over switches 62, 65, 67, 70, 72, 75 are connected to the sides of the lines 64, 69, 74, then the attenuation amount between the terminals 60 and 61 is changed in response to the switching of respective switches as shown in the table 1 below:

TABLE 1

| Switches 62/65 | Switches 67/70 | Switches 72/75 | Attenuation amount between terminals 60, 61 |
|---|---|---|---|
| "0" | "0" | "0" | 0 dB (reference value) |
| "1" | "0" | "0" | 4 dB |
| "0" | "1" | "0" | 8 dB |
| "1" | "1" | "0" | 12 dB |
| "0" | "0" | "1" | 16 dB |
| "1" | "0" | "1" | 20 dB |
| "0" | "1" | "1" | 24 dB |
| "1" | "1" | "1" | 28 dB |

In this apparatus, when the change-over switches 62, 65, 67, 70, 72, 75 are formed of electronic circuits, devices such as field-effect transistor with a satisfactory high-frequency characteristic are used. In that case, although an FET made of gallium arsenide (GaAs) is generally used, such device is large in chip size when formed as an integrated circuit (IC). Moreover, the above apparatus requires a plurality of elements, and hence the apparatus becomes expensive.

Furthermore, the above apparatus has many blocks through which the high-frequency signal passes. Hence, such apparatus is difficult to be manufactured in a discrete fashion, and should be formed as IC. Therefore, when such apparatus is formed in an IC, the step value cannot be varied, and the apparatus cannot be shared.

SUMMARY OF THE INVENTION

In view of the aforesaid aspect, it is an object of the present invention to provide a high-frequency signal step attenuator which can solve the problems encountered with a conventional attenuator.

It is an object of the present invention to provide a high-frequency signal step attenuator which can be made inexpensive.

It is another object of the present invention to provide a high-frequency signal step attenuator in which a step value can be easily changed.

It is a further object of the present invention to provide a high-frequency signal step attenuator by which the apparatus can be shared with ease.

According to the present invention, there is provided a high-frequency signal step attenuator which includes an amplifying circuit having a transistor element with the base or gate connected to an input terminal to which a high-frequency input signal is supplied, and supplying an amplified output signal of the input signal to an output terminal, a current detector for detecting a current flowing through a current path of collector-emitter or a current path of drain-source of the transistor element to generate an output voltage corresponding to a detected current, a voltage setter for selectively generating output voltages of different levels, and a comparator for comparing the output voltage of the current detector with the output voltage of the voltage setter, and supplying an output signal of a compared result to the base or gate of the transistor element. Thus, a feedback control is carried out such that the current flowing in the transistor element is changed in response to the output voltage of the voltage setter.

According to the present invention, since the step value is set by a DC voltage, the apparatus can be made inexpensive. Further, since the apparatus can be formed in a discrete fashion, the step value can be varied with ease, and the apparatus can be shared with ease.

DETAILED DESCRIPTION OF THE PREFERRED EMBODIMENT

According to the present invention, a high frequency input signal is supplied to a base or gate of an active element, and a high frequency output signal of which gain is controlled is obtained from the active element. Also, a current flowing collector-emitter or drain-source of the active element is detected, and the base or gate of the active element is controlled such that this current is changed in response to a set voltage of step value set by a voltage setting means.

Figure 1:
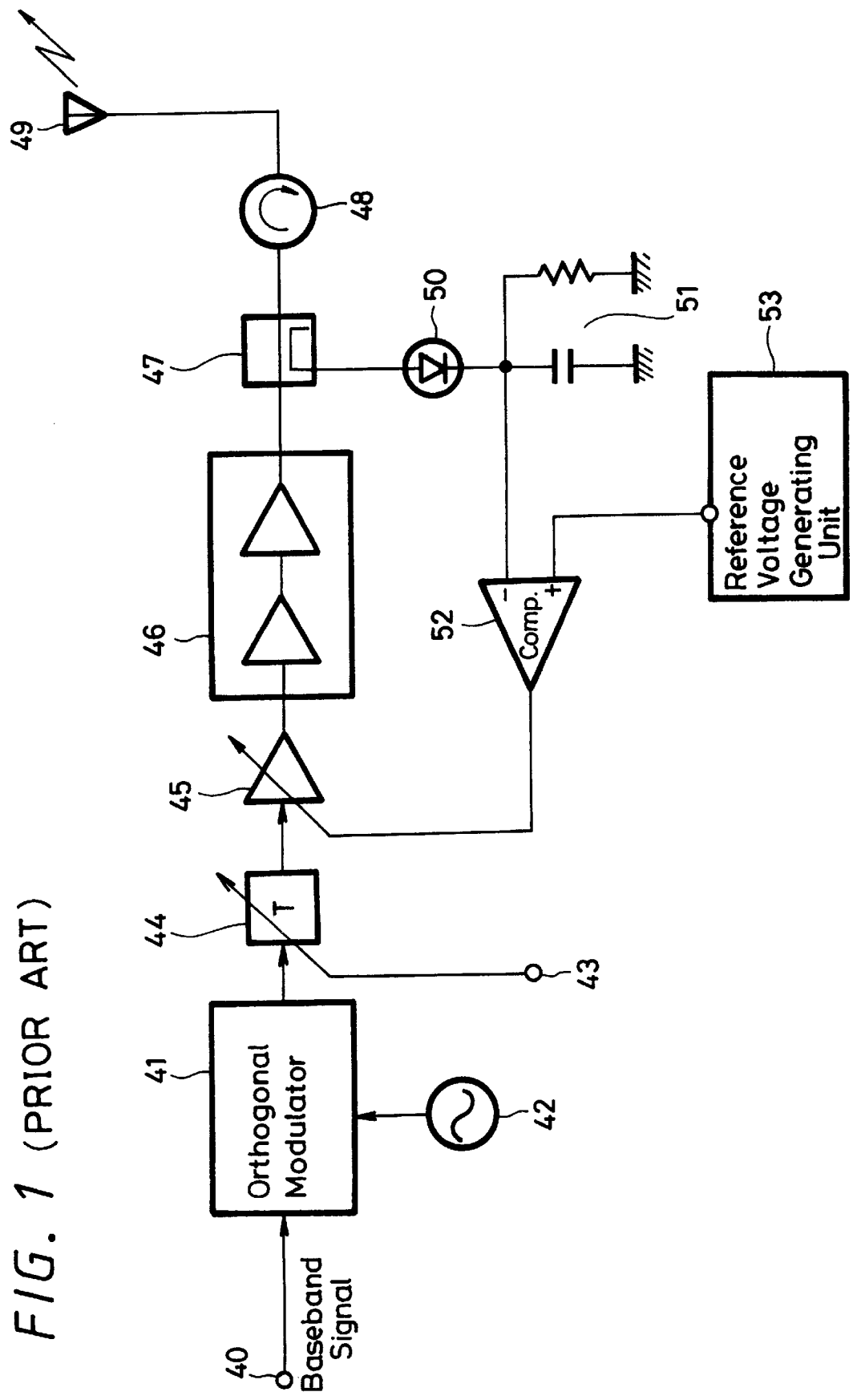
FIGS. 1 and 2 are diagrams used to explain a transmission output power control circuit for a transmission circuit applied to a portable telephone system.
Figure 2:
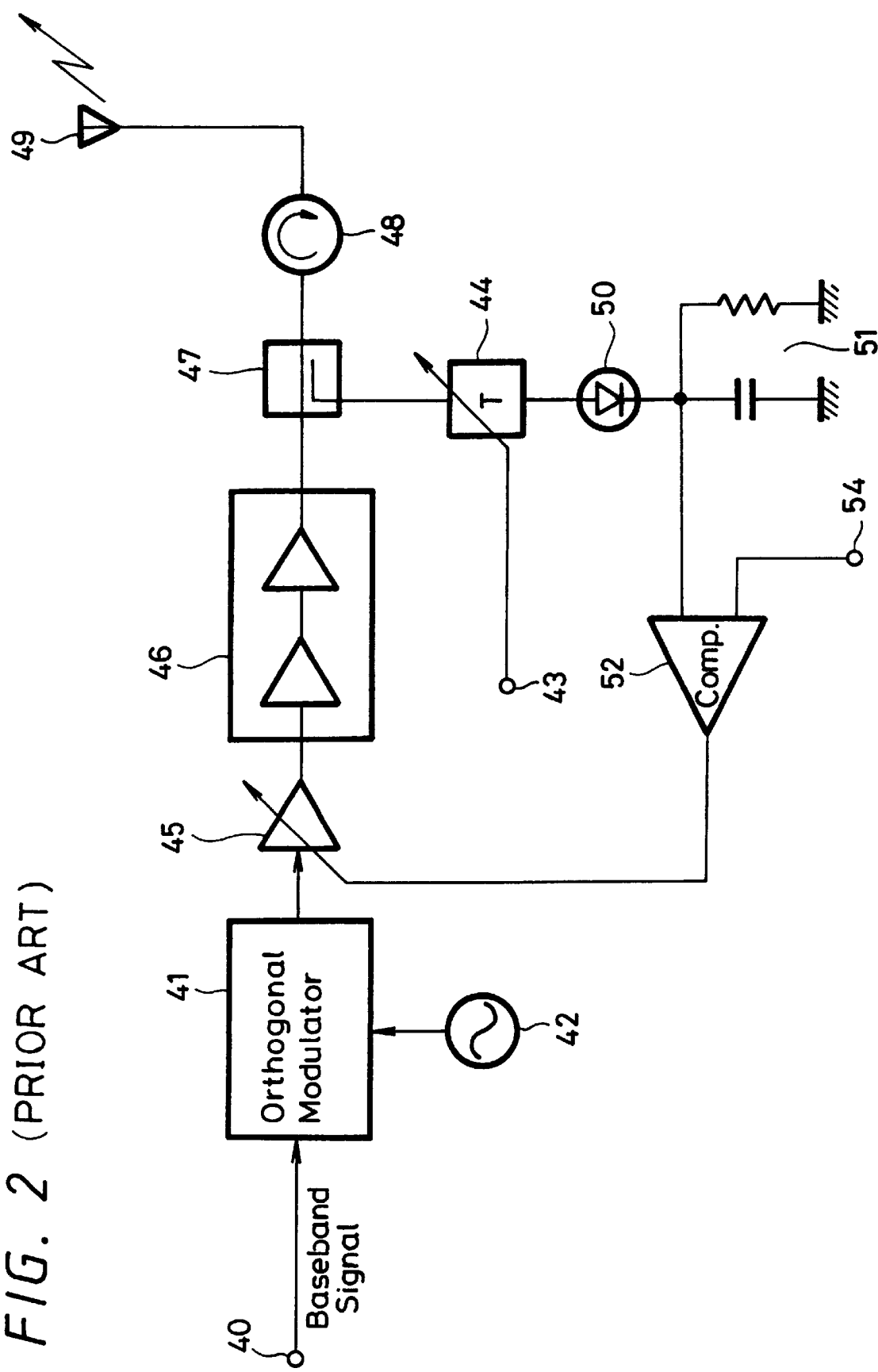
Figure 3:
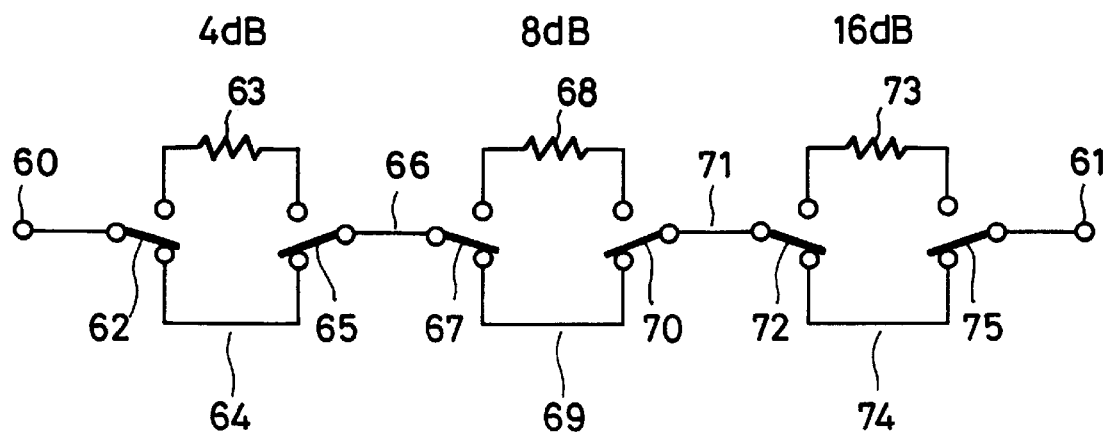
FIG. 3 is a diagram used to explain a conventional high-frequency step attenuator.
Figure 4:
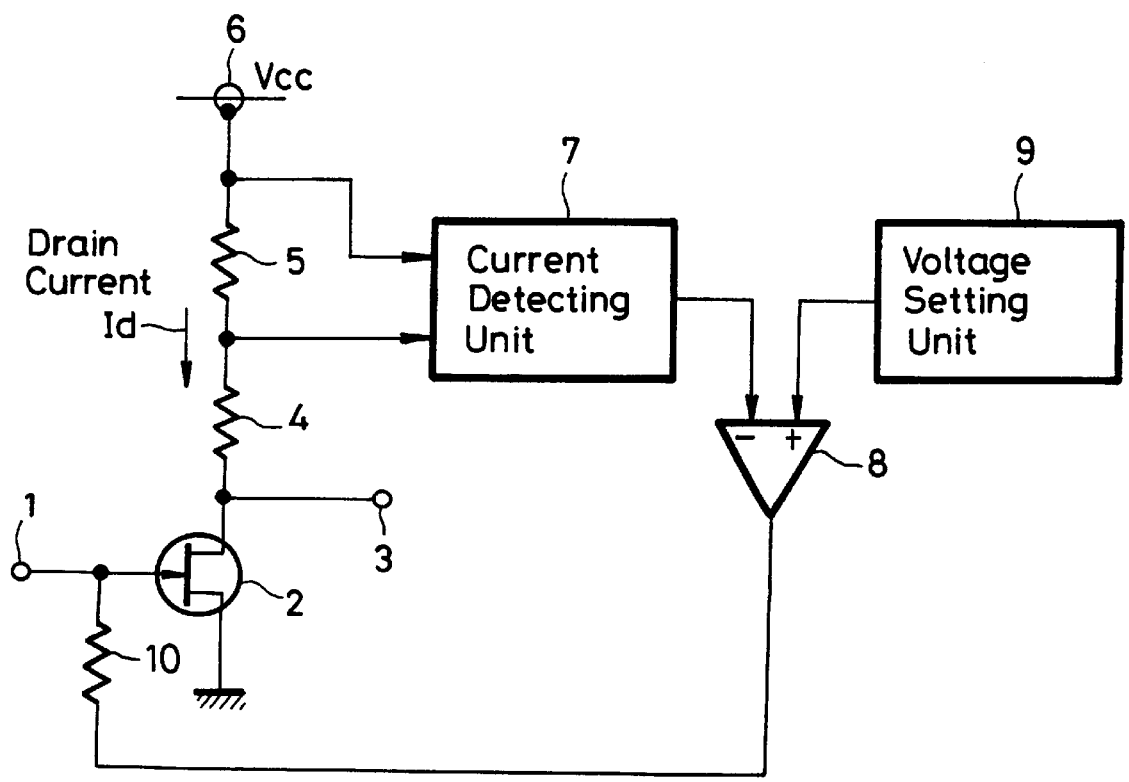
FIG. 4 is a diagram showing a high-frequency step attenuator according to an embodiment of the present invention.

The present invention will be described below with reference to the drawings. FIG. 4 is a block diagram showing a high-frequency signal step attenuator according to an embodiment of the present invention.

As shown in FIG. 4, a high-frequency signal from the above orthogonal modulator 41 or directional coupler 47 is supplied to an input terminal 1. The signal applied to the input terminal 1 is supplied to a gate of an active element, e.g., FET 2 for varying an attenuation amount (gain) of a high-frequency signal. The source of the FET 2 is grounded, and a signal obtained at the drain of the FET 2 is developed at an output terminal 3.

The drain of the FET 2 is connected through resistors 4, 5 to a power supply terminal 6 to which a power supply voltage Vcc is supplied. Thus, a lowered voltage proportional to a drain current Id of the FET 2 is generated across the resistor 5. This lowered voltage is supplied to a current detecting unit 7, and a detected voltage corresponding to a current detected by the current detecting unit 7 is supplied to a negative input terminal of a comparator 8.

There is provided a voltage setting unit 9 for selectively generating voltages of different DC levels, i.e., step values. A set voltage set by the voltage setting unit 9 is supplied to a positive input terminal of the comparator 8. An output signal of compared result from the comparator 8 is supplied through a resistor 10 to the gate of the FET 2. Thus, a feedback control is carried out such that the detected voltage from the current detecting unit 7 and the set voltage set by the voltage setting unit 9 become equal to each other.

Accordingly, the drain current Id of the FET 2 is controlled in a feedback fashion in response to the set voltage set by the voltage setting unit 9. In this case, a mutual conductance gm of gallium arsenide (GaAs) FET is expressed by the equation (1) below:

$$gm = \frac{\epsilon}{q \cdot No} \cdot X \cdot Id \qquad (1)$$

where $\epsilon$ is a dielectric constant of GaAs, q is an electric charge of electron, No is an electron concentration of n-type GaAs, and X is a constant of physical dimension of n-type GaAs.

In the above equation (1), values other than the drain current Id on the right-hand side are all constants, and the drain current Id and the mutual conductance gm are proportional to each other in the equation (1).

Figure 5A:
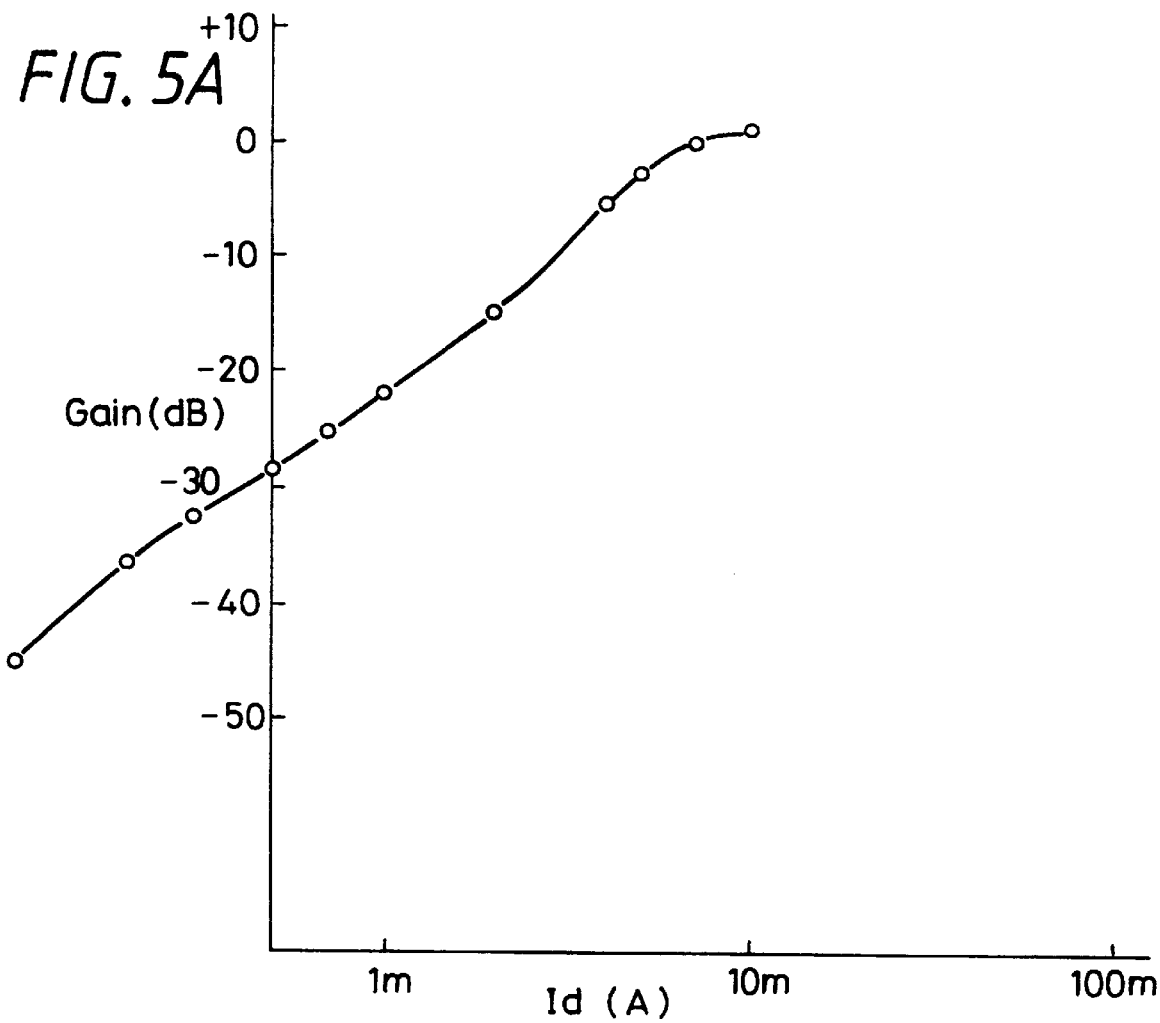
FIG. 5A is a graph showing data of drain current versus gain (dB) of FET.
Figure 5B:
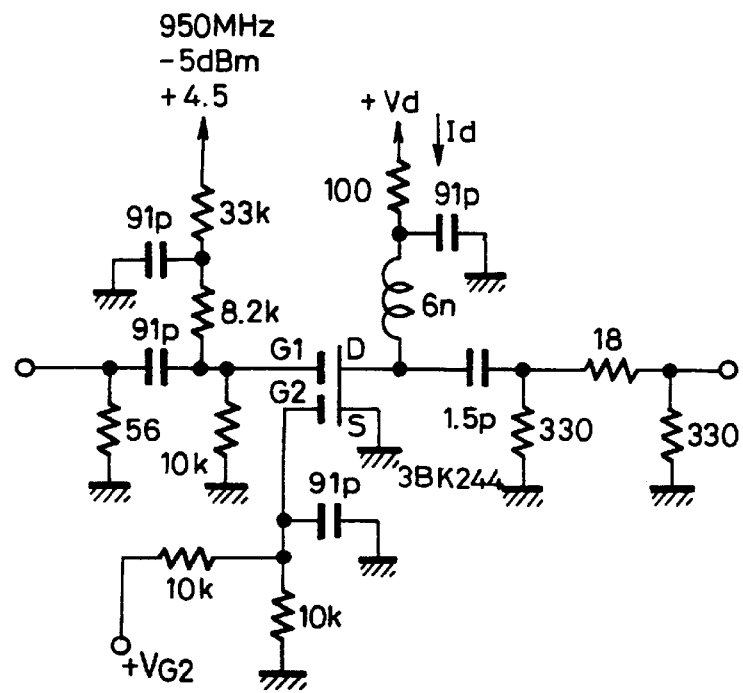
FIG. 5B is a diagram showing a dual-gate FET.

FIG. 5A shows an example of data of drain current Id versus gain (dB) in a dual-gate FET in a circuit shown in FIG. 5B. Study of FIG. 5A reveals that the drain current and the gain are proportional to each other in a dynamic range of 30 dB.

Therefore, in the above-mentioned apparatus, the gain (attenuation amount) of high-frequency signal supplied through the FET 2 can be changed in response to step values of set voltage set by the voltage setting unit 9 by controlling the drain current ID in response to the set voltage set by the voltage setting unit 9.

Figure 6:
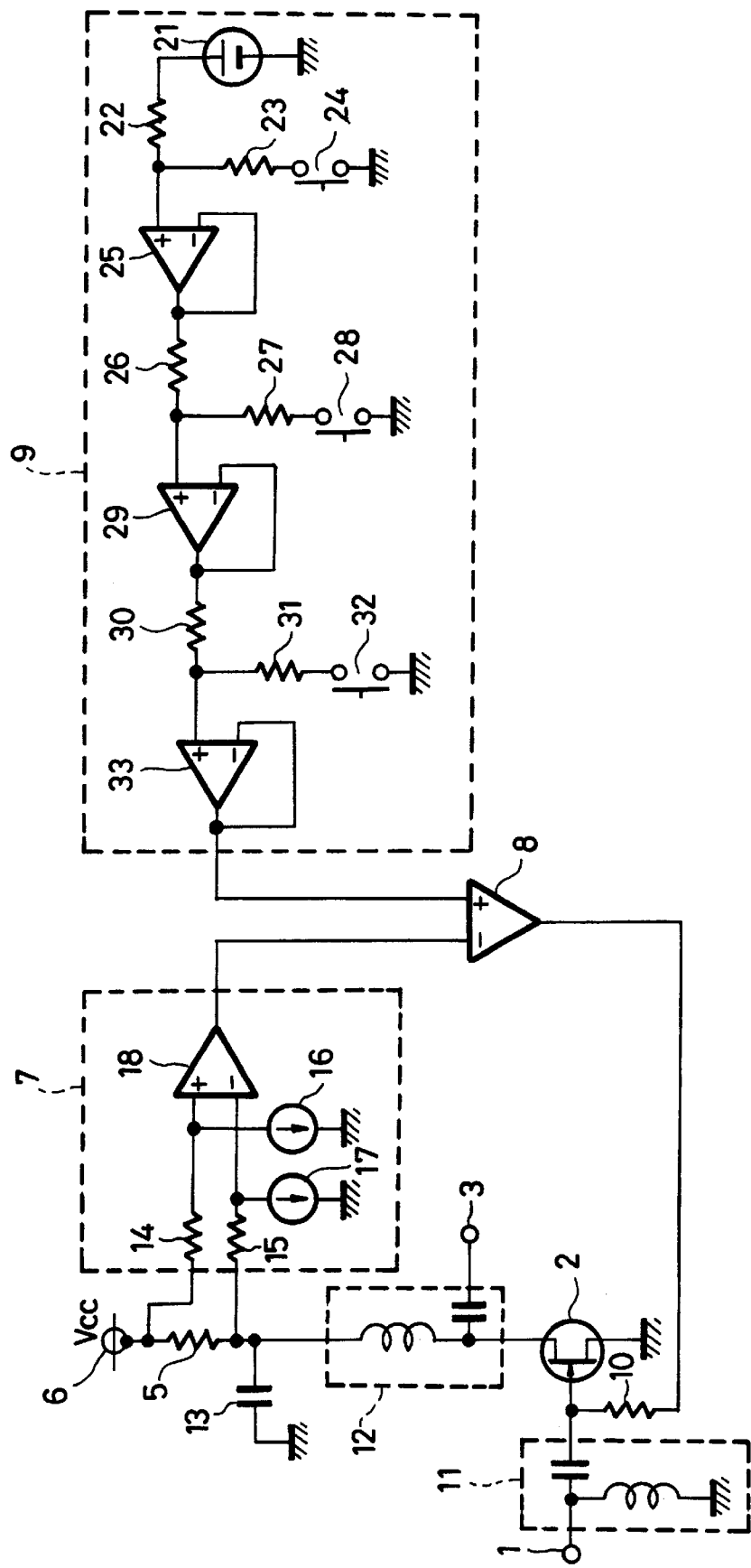
FIG. 6 is a diagram showing a specific circuit arrangement of a high-frequency signal step attenuator according to the present invention.

FIG. 6 shows an example of specific circuit arrangement of a high-frequency signal step attenuator according to the present invention. In FIG. 6, like parts corresponding to those of FIG. 4 are marked with the same references.

As shown in FIG. 6, a high-frequency signal from the input terminal 1 is supplied through an impedance matching circuit 11 to the gate of the FET 2. A signal obtained at the drain of the FET 2 is supplied through an impedance matching circuit 12, which is provided instead of the resistor 4, to the output terminal 3, and is grounded through a capacitor 13.

Both ends of the resistor 5 are grounded through resistors 14, 15 and constant current sources 16, 17 comprising the current detecting unit 7. Junctions of the resistors 14, 15 and the constant current sources 16, 17 are connected to a differential amplifier 18, whereby the lowered voltage proportional to the drain current Id of the FET 2 and which is generated across the resistor 5 is arbitrarily amplified by the differential amplifier 18. An output voltage from the differential amplifier 18 is fed to the negative input terminal of the comparator 8.

A negative end of a constant voltage source 21 comprising the voltage setting unit 9 is grounded, and a positive end thereof is grounded through a series circuit of resistors 22, 23 and a switch 24. A junction between the resistors 22 and 23 is connected to an input terminal of a buffer amplifier 29, and an output of the buffer amplifier 29 is grounded through a series circuit of resistors 30, 31 and a switch 32. A junction between the resistors 30 and 31 is connected to the input terminal of a buffer amplifier 33.

In this voltage setting unit 9, desired set voltages set at arbitrary step values can be obtained in the output of the buffer amplifier 33 by setting on/off of the switches 24, 28, 32.

A voltage corresponding to the drain current provided at 0 dB (set voltage at minimum loss) of the step attenuator 9 is set in the constant voltage source 21. If a ratio of resistances of the resistors 22, 23 is set to 0.585:1, a ratio of resistances of the resistors 26, 27 is set to 1.512:1, and a ratio of resistances of the resistors 30, 31 is set to 5.310:1, then attenuation amounts obtained when the resistors are divided can be determined as 4 dB, 8 dB and 16 dB, respectively.

Therefore, in this circuit, under the condition that the attenuation amount obtained when all switches 24, 28, 32 are turned off is taken as a reference attenuation amount, i.e., 0 dB, if the switch 24, for example, is turned on, the set voltage obtained in the output of the buffer amplifier 33 is attenuated by 4 dB. If the switch 28 is turned on, then the set voltage obtained in the output of the buffer amplifier 33 is attenuated by 8 dB.

Further, if the switch 32 is turned on, the set voltage obtained in the output of the buffer amplifier 33 is attenuated by 16 dB. If a plurality of switches are turned on simultaneously, the set voltage obtained in the output of the buffer amplifier 33 is attenuated by total attenuation amounts, i.e., 28 dB. Set voltages obtained in the output of the buffer amplifier 33 can be determined as shown on the following table 2 in response to the setting of on/off of the switches 24, 28, 32.

TABLE 2

| Switch 32 | Switch 28 | Switch 24 | Attenuation amount |
| --- | --- | --- | --- |
| OFF | OFF | OFF | 0 dB (reference value) |
| ON | OFF | OFF | 4 dB |
| OFF | ON | OFF | 8 dB |
| ON | ON | OFF | 12 dB |
| OFF | OFF | ON | 16 dB |

TABLE 2-continued

| Switch 32 | Switch 28 | Switch 24 | Attenuation amount |
|---|---|---|---|
| ON | OFF | ON | 20 dB |
| OFF | ON | ON | 24 dB |
| ON | ON | ON | 28 dB |

The set voltage of the selected attenuation amount is supplied to a positive input terminal of the comparator 8, and an output signal of compared result from the comparator 8 is supplied through the resistor 10 to the gate of the FET 2. A feedback control is carried out such that the set voltage and the lowered voltage proportional to the drain current Id of the FET 2 from the differential amplifier 18 become equal to each other.

In the whole apparatus shown in FIG. 6, the gain (attenuation amount) of the high-frequency signal flowing in the FET 2 can be varied in response to step values of the set voltages set by the voltage setting unit 9 by controlling the drain current Id in response to the set voltage set by the voltage setting unit 9.

In this case, the switches 24, 28, 32 for setting attenuation amounts are used to turn on/off the DC voltage. Therefore, when these switches 24, 28, 32 are formed of electronic switches, any special elements are not required, and the switches 24, 28, 32 can be formed of inexpensive electronic switches.

Further, the voltage setting unit 9 can be formed of discrete elements. Therefore, a high-frequency signal step attenuator of desired step value can be formed by arbitrarily setting ratios of resistances of the resistors 22, 23, 26, 27, 30, 31, and the apparatus can be shared with ease.

In the above apparatus, the active element which can vary the attenuation amount (gain) of the high-frequency signal is not limited to the GaAs FET, and may be a bipolar transistor, for example. In that case, the mutual conductance gm of bipolar transistor is expressed by the equation (2) below:

$$gm = \frac{q}{k \cdot T} \cdot Ic \qquad (2)$$

where q is an electric charge of electron, k is a Boltzmann constant, and T is an absolute temperature.

Accordingly, in the equation (2), values other than the collector current Ic on the right-hand side are all constants, and the collector current Ic and the mutual conductance gm are proportional to each other in the equation (2).

In the above apparatus, the resistor 5 for detecting the drain current Id or the collector current Ic may be provided on either the drain or source side of the FET or either the collector or emitter side of the bipolar transistor.

As described above, according to the high-frequency signal step attenuator, it is possible to solve the following problems that the conventional apparatus faces. That is, the conventional apparatus needs elements such as FETS with a satisfactory high-frequency characteristic, and hence the conventional apparatus becomes expensive. Further, since the elements are formed in an IC, the step value cannot be varied, and hence the apparatus cannot be shared. However, according to the present invention, a high-frequency input signal is supplied to the active element which derives a high-frequency output signal whose gain is controlled. Also, a current flowing through the active element is detected, and a feedback control is carried out such that the above current is changed in response to a set voltage of a predetermined step value. Therefore, since the step value is set in the form of DC voltage, the apparatus can be made inexpensive. Furthermore, since the apparatus can be formed in a discrete fashion, the step value can be varied and the apparatus can be shared easily.

When the above apparatus is applied to the portable telephone system, in the mobile station with a transmission power of 0.8 W in the PDC, for example, under the condition that the maximum transmission output electric power is set to 0 dB, the transmission output electric power can be easily set in a range of from 0 to −20 dB at the step of 4 dB by the inexpensive apparatus.

Further, since the step value can be easily varied, even when different step values are set in other portable telephone system than the PDC, the apparatus according to the present invention can cope with such different step values, and the apparatus can be shared easily.

Furthermore, the use of the high-frequency signal step attenuator according to the present invention is not limited to the transmission circuit of the mobile station in the portable telephone system. When the high-frequency signal step attenuator according to the present invention is applied to the transmission circuit, the modulator is not limited to the above orthogonal modulator.

As described above, according to the present invention, it is possible to solve the following problems that the conventional apparatus faces. That is, the conventional apparatus needs elements such as FETS with a satisfactory high-frequency characteristic, and hence the conventional apparatus becomes expensive. Further, since the elements are formed in an IC, the step value cannot be varied, and hence the apparatus cannot be shared. However, according to the present invention, a high-frequency input signal is supplied to the active element which derives a high-frequency output signal whose gain is controlled. Also, a current flowing through the active element is detected, and a feedback control is carried out such that the above current is changed in response to a set voltage of a predetermined step value. Therefore, since the step value is set in the form of DC voltage, the apparatus can be made inexpensive. Further, since the apparatus can be formed in a discrete fashion, the step value can be varied and the apparatus can be shared easily.

Therefore, when the above apparatus is applied to the transmission circuit of the mobile station in the portable telephone system, the transmission output power can be easily set with an arbitrary step value by the inexpensive apparatus. Also, since the step value can be easily varied, when different step values are determined in a different portable telephone system, the apparatus according to the present invention can easily cope with such different step values, and the apparatus can be shared with ease.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A high-frequency signal step attenuator comprising:
    an amplifying circuit including a transistor element with one of a base and a gate connected to an input terminal to which a high-frequency input signal is supplied, wherein said amplifying circuit supplies an amplified output signal of said high-frequency input signal to an output terminal;
    a current detector for detecting a current flowing through one of a current path of a collector-emitter and a current path of a drain-source of said transistor element to generate an output voltage corresponding to said current;

a voltage setter for selectively generating output voltages of different levels and producing a selected output voltage; and a comparator for comparing said output voltage of said current detector with said selected output voltage of said voltage setter and for producing a compared result, and supplying an output signal of said compared result as a feedback signal to one of said base and said gate of said transistor element, wherein said voltage setter includes:

a DC voltage source; and a plurality of voltage dividers including a plurality of resistors and switches connected, respectively, in series and supplied with an output voltage generated by said DC voltage source.

2. The high-frequency signal step attenuator as claimed in claim 1, wherein said current detector includes:

a resistor connected in series with said current path of one of said collector-emitter and said current path of said drain-source; and a differential amplifier to which said output voltage of said current detector generated across said resistor is supplied.

3. The high-frequency signal step attenuator as claimed in claim 1, further comprising a receiver and wherein said high-frequency input signal is a modulated signal with a high frequency supplied by a transmitter, and wherein said voltage setter generates said selected output voltage based on a control signal received by said receiver.

* * * * *